(12) United States Patent
Yoshimura

(10) Patent No.: US 6,268,812 B1
(45) Date of Patent: Jul. 31, 2001

(54) OPTICAL ROTATING RECORDING MEDIUM, DATA RECORDING METHOD, RECORDING APPARATUS AND REPRODUCING APPARATUS

(75) Inventor: Shunji Yoshimura, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/695,346

(22) Filed: Oct. 24, 2000

(30) Foreign Application Priority Data

Oct. 29, 1999 (JP) .................................................. 11-310394

(51) Int. Cl.⁷ ........................................................ H03M 5/06
(52) U.S. Cl. .................................. 341/68; 341/59; 341/61
(58) Field of Search .................................. 341/68, 59, 61, 341/58, 73, 50, 56, 81; 371/37.1; 375/340

(56) References Cited

U.S. PATENT DOCUMENTS 5,844,507 * 12/1998 Zook ........................................ 341/50
5,933,103 * 8/1999 Kim ........................................ 341/59
6,046,691 * 4/2000 Aziz et al. ............................... 341/58

* cited by examiner

Primary Examiner—Brian Young
Assistant Examiner—John Nguyen
(74) Attorney, Agent, or Firm—Oblon, Spivak, McClelland, Maier & Neustadt, P.C.

(57) ABSTRACT

An optical rotating recording medium in which a 17-bit codeword is recorded converted from a 16 bit data, wherein (i) a 16-bit data word is coded to a 17-bit codeword set with restrictive conditions on a minimum number (d) of consecutive zeros, a maximum number (k) of consecutive zeros, and a maximum number (r) of consecutive "1"s in the codeword; (ii) a "1" in a codeword is converted to an inversion of "1" and "0" in recording data and a "0" in a codeword to non-inversion by non-return to zero inverse (NRZI), and (iii) a "1" and "0" in the recording data are stored linked with one of the existence of a bit on the optical rotating recording medium and two polarities of magnetization and a data recording method, a recording apparatus, and a reproducing apparatus relating to the same.

21 Claims, 11 Drawing Sheets

Table 1  8-BIT DATA NOT INCLUDED IN TABLE 1

Table 2
CONVERSION FROM DATA IN TABLE 2 TO DATA IN TABLE 1

| INPUT | E1 | E2 | E3 |
|---|---|---|---|
| 00000000 | 11000001 | 11001101 | 11011010 |
| 00000001 | 00010001 | 01000001 | 10010001 |
| 00000010 | 00010010 | 01000010 | 10010010 |
| 00000011 | 00010011 | 01000011 | 10010011 |
| 00000100 | 00010100 | 01000100 | 10010100 |
| 00000101 | 00010101 | 01000101 | 10010101 |
| 00000110 | 00010110 | 01000110 | 10010110 |
| 00000111 | 00010111 | 01000111 | 10010111 |
| 00001000 | 11000010 | 11001110 | 11011011 |
| 00001001 | 00011001 | 01001001 | 10011001 |
| 00001010 | 00011010 | 01001010 | 10011010 |
| 00001011 | 00011011 | 01001011 | 10011011 |
| 00001100 | 00011100 | 01001100 | 10011100 |
| 00001101 | 00011101 | 01001101 | 10011101 |
| 00001110 | 00011110 | 01001110 | 10011110 |
| 00001111 | 00101111 | 11001100 | 11011001 |
| 00010000 | 00100001 | 01010001 | 10100001 |
| 00011000 | 00110001 | 01100001 | 10110001 |
| 00011111 | 11101001 | 01001111 | 10000010 |
| 00100000 | 00100010 | 01010010 | 10100010 |
| 00101000 | 00110010 | 01100010 | 10110010 |
| 00110000 | 00100011 | 01010011 | 10100011 |
| 00111000 | 00110011 | 01100011 | 10110011 |
| 00111111 | 11101111 | 01101111 | 10000011 |
| 01000000 | 00100100 | 01010100 | 10100100 |
| 01001000 | 00110100 | 01100100 | 10110100 |
| 01010000 | 00100101 | 01010101 | 10100101 |
| 01011000 | 00110101 | 01100101 | 10110101 |
| 01011111 | 11101011 | 01111001 | 10000100 |
| 01100000 | 00100110 | 01010110 | 10100110 |
| 01101000 | 00110110 | 01100110 | 10110110 |
| 01110000 | 00100111 | 01010111 | 10100111 |
| 01111000 | 00110111 | 01100111 | 10110111 |
| 01111110 | 11000011 | 11001111 | 11011100 |
| 01111111 | 11101100 | 01111010 | 10000101 |
| 10000000 | 11000100 | 11010001 | 11011101 |
| 10000001 | 11000101 | 11010010 | 11011110 |
| 10001000 | 11000110 | 11010011 | 11110010 |
| 10010000 | 00101001 | 01011001 | 10101001 |
| 10011000 | 00111001 | 01101001 | 10111001 |
| 10011111 | 11101101 | 01111011 | 10000110 |
| 10100000 | 00101010 | 01011010 | 10101010 |
| 10101000 | 00111010 | 01101010 | 10111010 |
| 10110000 | 00101011 | 01011011 | 10101011 |
| 10111000 | 00111011 | 01101011 | 10111011 |
| 10111111 | 11101110 | 01111100 | 10000111 |
| 11000000 | 00101100 | 01011100 | 10101100 |
| 11001000 | 00111100 | 01101100 | 10111100 |
| 11010000 | 00101101 | 01011101 | 10101101 |
| 11011000 | 00111101 | 01101101 | 10111101 |
| 11011111 | 11110001 | 01111101 | 10101111 |
| 11100000 | 00101110 | 01011110 | 10101110 |
| 11101000 | 00111110 | 01101110 | 10111110 |
| 11101111 | 11000111 | 11010100 | 11110011 |
| 11110000 | 11001001 | 11010101 | 11110100 |
| 11110111 | 11001010 | 11010110 | 11110101 |
| 11111000 | 11001011 | 11010111 | 11110110 |
| 11111001 | 11100001 | 01110001 | 10001001 |
| 11111010 | 11100010 | 01110010 | 10001010 |
| 11111011 | 11100011 | 01110011 | 10001011 |
| 11111100 | 11100100 | 01110100 | 10001100 |
| 11111101 | 11100101 | 01110101 | 10001101 |
| 11111110 | 11100110 | 01110110 | 10001110 |
| 11111111 | 11100111 | 01110111 | 10001111 |

FIG. 13

Table 3

| dataH | dataL | P | C | Q |
|---|---|---|---|---|
| T | T | dataH | 0 | dataL |
| F | T | E1(dataH) | 1 | dataL |
| T | F | E2(dataL) | 1 | dataH |
| F | F | E3(dataH) | 1 | E3(dataL) |

FIG. 14

Table 4

Table 6

| P | C | dataH | dataL |
|---|---|-------|-------|
| X | 0 | P | Q |
| T1 | 1 | D1 (P) | Q |
| T2 | 1 | Q | D2 (P) |
| T3 | 1 | D3 (P) | D3 (Q) |

OPTICAL ROTATING RECORDING MEDIUM, DATA RECORDING METHOD, RECORDING APPARATUS AND REPRODUCING APPARATUS

BACKGROUND OF THE INVENTION

1. Field of the Invention

The present invention relates to an optical rotating recording medium, a recording method, a recording apparatus, and a reproducing apparatus, more particularly a medium, method, and apparatuses using a 16/17 modulation method (16/17 conversion method) modulating 16 bits of digital data to 17 bits of digital data.

The present invention also relates to an optical recording/reproducing apparatus combining the above recording apparatus and reproduction apparatus.

2. Description of the Related Art

As optical rotating recording media used for recording and reproducing digital data including video data, and audio data, compact disks (CDs), Mini Discs (MDs), and digital versatile disks (DVDs) (including DVD-RAM etc.) are known. In this specification, optical disks or optical-magnetical (MO) disks are called as optical recording media or optical rotating recording media. Hitherto, CDs and DVDs have been widely used as package media and MDs as music recording media. Reproducing apparatuses for reproducing data from such media and recording apparatuses for recording data on such media are also widely used.

CDs which are the basis of these technologies, are applied technology enabling the maximum performance in read only optical disks. For example, the signal to be recorded thereon is a so-called run-length limited (2, 10) code (hereinafter referred to as an RLL (2, 10) code) wherein the number of consecutive "0"s is limited from 2 to 10. Such the RLL is an eight to 14 modulation (EFM) for converting 8-bit data to 14-bit codewords and inserting 3 bits between the respective codewords in CDs and MDs, and 8/16modulation for converting 8-bit data to 16-bit codewords in DVDs.

Recording data to be recorded on optical rotating recording media is recorded by the followings: (a) by a non-return to zero inverse (NRZI) modulation wherein "1"s of the codewords are converted to be the inverse of the recording data "1" and "0", "0" of the codeword is converted to non-inversion, and (b) a "1" and "0" of the recording data are linked with the existence of pits on a magneto-optical disk or two polarities of magnetization. Accordingly, when using the above NRZI modulation code, the inversion intervals of the recording data become, when assuming a bit length of one codeword is T, 3T at a minimum and 11T at a maximum.

On the other hand, 1T corresponds to 0.47Tb (Th is a data bit length) in EFM, while 1T corresponds to 0.5Tb in 8/16modulation.

When considering the fact that the codeword bit length is the detection window width itself at the time of data modulation, a code having relatively broad minimum inversion interval and a relatively short detection window width of about half the data bit length particularly exhibits its features when the code is applied to read only disks which are little noise and show a good reproduction signal quality.

In recent years, however, there have been increasing demands for recording a large amount of digital data including compressed video data, compressed audio data, etc. on an optical disk or a magneto-optical disk.

As such a magneto-optical disk, there is proposed, for example, the invention of a magneto-optical disk described in Japanese Patent Application No. 11-176029 entitled "Optical Recording Media and Disk Cartridge" filed by the present assignee on Jun. 22, 1999. Such the optical disk is very compact, high density, and large capacity of a diameter of 50 mm and a storage capacity of 2 GB or a diameter of 64 mm and a storage capacity of 4 GB. In these cases, a blue laser is used as laser diode.

In such cases, to store a large amount of data on a writeable magneto-optical disk, sometimes, it is obtained better results by narrowing the minimum inversion interval and the resultant widening the detection window width rather than by using the above code where the run-length is limited to (2, 10) and the resultant detection window is narrowed.

The 16/17 modulation system is known as a modulation format securing a wide detection window width. The 16/17 modulation system is for converting 16 bits of data to a 17-bit codeword, while the run-length is limited from 0 to 6 in many cases. The 16/17 modulation system is widely used for example in a magnetic recording field. Such technology is disclosed in Japanese Unexamined Patent Publication (Kokai) Nos. 9-27171, 10-322217, 11-162113, and 10-1324520.

It should be noted that the above 16/17 modulation is optimized to be applied to a magnetic recording field, typically a partial response class 4 (PR4). Namely, note was taken of the fact that the response characteristic of a recording/reproducing system in a magnetic recording field is a differential characteristic. The recording data is generated from codewords by an interleaved NRZI method shown in FIG. 1, an impulse response equalizes final transfer characteristics to the PR4 characteristics shown in FIG. 2, and furthermore the data is reproduced by the maximum likelihood decoding method such as a Viterbi algorithm.

Reference number 101 in FIG. 1 shows a delay element giving a 2-clock delay by a codeword bit clock, while reference number 102 shows a processor for addition in modulo 2, that is, for an exclusive OR operation.

In the above 16/17 modulation applied to magnetic recording, the number of consecutive "0"s restricted to be not more than a certain number even when extracting data from a codeword every other bit, corresponding to the case of reproducing data by the above maximum likelihood decoding method.

Summarizing the problems to be solved by the invention, when assuming application of 16/17 modulation which is basically applied to the above magnetic recording, will be applied to an optical rotating recording media such as an optical disk or magneto-optical disk, the following problems may be encountered.

The response characteristics of a recording/reproducing system for an optical rotating recording media does not have differential characteristics like with magnetic recording. Accordingly, when recording data on optical rotating recording media etc., recording data is generated from codewords by the NRZI method, the reproducing signal is simply discriminated to be binary a value by the threshold value at time of reproduction, the final transfer characteristic of the impulse response thereof is equalized to the characteristics called partial response (1,1) (hereinafter referred to as PR(1, 1)) as shown in FIG. 3, and furthermore the data is reproduced by the maxim-m likelihood decoding method such as a Viterbi algorithm etc. In this case, the above limitation in magnetic recording that the number of consecutive "0"s be not more than a certain number even when extracting every other data from the codewords, becomes meaningless.

PR4 and PR(1,1) will be compared from another viewpoint. FIGS. 2 and 3 are views of on impulse responses when the time is indicated an abscissa. When the frequency is indicated on an abscissa for comparison of PR4 and PR(1,1), PR4 becomes a sine wave and PR(1,1) becomes a cosine wave. Namely, the characteristics of PR4 for the magnetic recording and P(1,1) for the optical rotating recording media are basically different on the characteristics.

In the optical rotating recording media of the PR(1,1), when "1" continues in a codeword, the reproduction signal becomes an intermediate value, so the generation of a synchronization clock by a phase locked loop (PLL) when reproducing data becomes difficult. Furthermore, the data error rate after decoding is largely affected on a maximum likelihood decoding method like a Viterbi algorithm.

The 16/17 modulation for the above magnetic recording does not suppress the low frequency components of the modulation wave. Thus, an offset fluctuation arises and there is a possibility that the bit error rate (BER) will become higher at the time of reproduction.

In addition, in an optical rotating recording media, level changes by low frequencies caused by changes in the reflectance, the birefringence of the disk substrate, etc. are sometimes superimposed on the reproduction signal. When using the threshold judgement and PR(1,1) characteristics, the fluctuation of the low frequency of the reproduction signal may occur the lowering of the BER, so the low frequency components are often removed from the reproduction signal by using a high-pass filter. However, when the original recording data includes a large amount of low frequency components, the removal of the same causes new level changes which result in the lowering the BER. The above 16/17 modulation adapted to magnetic recording is not taken into account on the affect by low frequency components included in the recording data, thus the modulation cannot be applied to optical rotating recording media.

When applying the 16/17 modulation system to optical rotating recording media, it is necessary to correctly recognize the punctuation of 17-bit codewords and if must be determined the synchronizing pattern meeting with the modulation system.

SUMMARY OF THE INVENTION

An object of the present invention is to provide an optical rotating recording medium capable of broadening a detection window width by narrowing the shortest inversion interval and storing a large amount of data in a writeable disk.

Another object of the present invention is to provide a data recording method in which, even when using a data reproduction method suited to the response characteristics of a recording/reproducing system of an optical rotating recording media, "1"s do not continue much in a codeword and, as a result, synchronized clock generation by a phase locked loop (PLL) becomes easy and the data error rate after decoding by a maximum likelihood method such as a Viterbi algorithm is not increased.

Still another object of the present invention is to provide a data recording method for adding a synchronizing pattern to correctly recognize a punctuation of a 17-bit codeword.

Still another object of the present invention is to provide a data recording method capable of removing affects such as a change of the reflectance of an optical rotating recording medium and birefringence of a substrate thereof, etc. by suppression of low frequency components of recording data, and removing the low frequency components from a reproduction signal by a high pass filter, etc.

Still another object of the present invention is to provide a recording apparatus and a reproduction apparatus using the above media and methods.

According to a first aspect of the present invention, there is provided an optical rotating recording medium in which a 17-bit codeword converted from 16 bit data is recorded, wherein said 17-bit codeword is coded from a 16 bit-data word as a set with restrictive conditions on a minimum number (d) of consecutive zeros, a maximum number (k) of consecutive zeros, and a maximum number (r) of consecutive "1"s in the codeword; is converted as a "1" in a codeword to an inversion of "1" and "0" in recording data and a "0" in a codeword to non-inversion by non-return to zero inverse (NRZI), and is recorded under the condition where a "1" and "0" in the recording data are linked with the existence and non-existence of a pit on the optical rotating recording medium or two polarities of magnetization.

The above optical rotating recording media can broaden a detection window width by narrowing the shortest inversion interval and can store a large amount of data.

According to a second aspect of the present invention, there is provided a data recording method for recording 16-bit data on an optical rotating recording medium by converting the same to a 17-bit codeword, including steps of: coding a 16-bit data word to a 17-bit codeword set with restrictive conditions on a minimum number (d) of consecutive zeros, a maximum number (k) of consecutive zeros, and a maximum number (r) of consecutive "1"s in the codeword; converting a "1" in a codeword to an inversion of "1" and "0" in recording data and a "0" in a codeword to non-inversion by non-return to zero inverse (NRZI); and storing a "1" and "0" in the recording data linked with the existence and non-existence of a bit on said optical rotating recording medium or two polarities of magnetization.

Preferably, the restrictive conditions of the coding method are that (d, k) is (0, 6) and r is not less than 4 and not more than 11.

Alternatively, preferably the restrictive conditions of the coding method are that (d, k, r)=(0, 6, 9).

Preferably, a series of an even number of bytes between 80 and 256 of data to be recorded on the optical rotating recording medium is defined as one frame; 2-byte's worth of a synchronizing pattern per frame is added; and the synchronizing pattern is made easy to distinguish from the codeword by deviating from at least one of the restrictive conditions.

Preferably, the synchronizing pattern deviates from the restriction of d=6 above and includes seven consecutive "0"s.

Preferably, as the synchronizing pattern, at least six patterns SYO to SYS selected from 10 synchronizing pattern in Table A below are used:

TABLE A (1) 00010001000000010
(2) 00010101000000010
(3) 00100001000000010
(4) 00100101000000010
(5) 00101001000000010
(6) 01000001000000010
(7) 01000101000000010
(8) 01001001000000010
(9) 01010001000000010
(10) 01010101000000010

Preferably, at least two bits for suppressing a low frequency component of a bit series after NRZI conversion are inserted into the codeword for at least every 34 bits and at most 102 bits of codewords in the data coded by the coding method, preferably for every 68 bits of codewords in the data coded by the coding method.

Preferably, the method further includes the steps of calculating a digital sum value (DSV) obtained by linking "1" in the recording data after the NRZI conversion to "+1" and "0" to "−1" and multiplying the values and determining bits for suppressing low frequency components by respectively selecting always "1" in the case where the k restriction in the predetermined restrictive conditions is violated when "0" is inserted to an inserting position, while selecting a value which gives a smaller absolute value of the DSV until the point where the next bit for suppressing the subsonic frequency component is inserted in other cases.

According to a third aspect of the present invention, there is provided a recording apparatus for recording a 17-bit codeword converted from a 16-bit data on an optical rotating recording medium, comprising a 16/17 conversion means; a synchronizing pattern adding means; a DSV control bit adding means; a non-return to zero inverse (NRZI) conversion means; and a magnetic field head driver means, wherein the 16/17 conversion means codes a 16-bit data word to a 17-bit codeword set with restrictive conditions of a minimum number (d) of consecutive zeros, a maximum number (k) of consecutive zeros, and a maximum number (r) of consecutive "1"s in the codeword; the NRZI conversion means converts a "1" in a codeword to an inversion of "1" and "0" of recording data and "0" in the codeword to non-inversion by NRZI; and the magnetic head driver means records linking a "1" and "0" of the recording data with one of an existence of a bit on the optical rotating recording medium and two polarities of magnetization.

According to a fourth aspect of the present invention, there is provided a reproducing apparatus for reproducing data recorded on an optical rotating recording medium, wherein: said optical rotating recording medium stores 17-bit codeword converted from a 16 bit data, said a 17-bit codeword is coded from the 16 bit data as a set with restrictive conditions of a minimum number (d) of consecutive zeros, a maximum number (k) of consecutive zeros, and a maximum number (r) of consecutive "1"s in a codeword; is converted as a "1" in a codeword is converted to an inversion of "1" and "0" of recording data and "0" in the codeword to non-inversion by NRZI, and is recorded under the condition where a "1" and "0" of the recording data are linked with the existence or non-existence of a pit on said optical rotating recording medium and two polarities of magnetization; and wherein said reproducing apparatus comprises: a means for reproducing a clock from data read from said optical rotating recording medium; a means for decoding the read data by a maximum likelihood method by referring to said reproduced clock; and a 16/17 conversion means for converting said decoded 17-bit codeword to a 16-bit data word.

BRIEF DESCRIPTION OF THE DRAWINGS

These and other objects and features of the present invention will become clearer from the following description of the preferred embodiments given with reference to the accompanying drawings, in which:

FIG. 8 is a view for explaining a part (1) of 192 patterns of 8-bit data at the time of 8—8 conversion;

FIG. 9 is a view for explaining a part (2) of 192 patterns of 8-bit data at the time of 8—8 conversion;

FIG. 10 is a view for explaining a part (3) of 192 patterns of 8-bit data at the time of 8—8 conversion;

FIG. 11 is a view of remaining 64 data in the 8-bit data not included in the data shown in FIGS. 8 to 10;

FIG. 12 is a view of correspondence in converting data in FIG. 11 to data in FIGS. 8 to 11;

FIG. 13 is a table of an coding method in a 16/17 conversion circuit;

FIG. 14 is a table of an example of synchronizing pattern used in a synchronizing pattern adding circuit;

FIG. 15 is an example of a combination of synchronizing patterns used in the synchronizing pattern adding circuit;

FIG. 16 is another example of a combination of synchronizing patterns used in the synchronizing pattern adding circuit; and FIG. 17 is a table of a decoding method in a 16/17 conversion circuit.

DESCRIPTION OF THE PREFERRED EMBODIMENTS

Below, preferred embodiments will be described with reference to the accompanying drawings.

Figure 1:
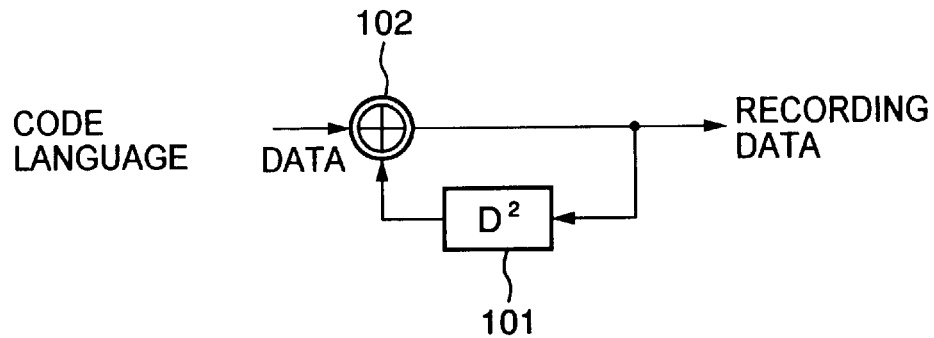
FIG. 1 is a view of the configuration of a processing circuit of an interleaved NRZI.
Figure 2:
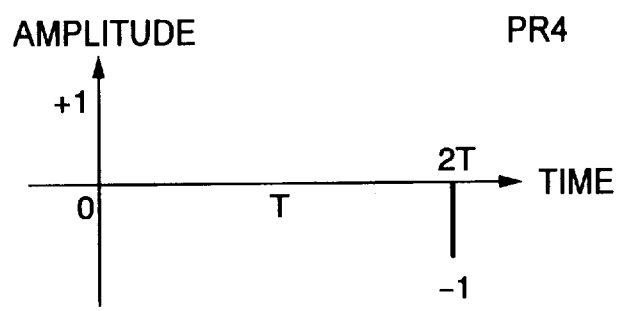
FIG. 2 is a graph of an impulse response of PR4 in magnetic recording.
Figure 3:
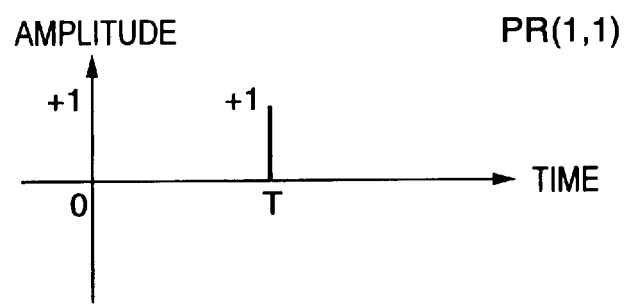
FIG. 3 is a graph of an impulse response of PR(1,1) exhibiting characteristics of an optical rotating recording medium such as an magneto-optical disk.
Figure 4:
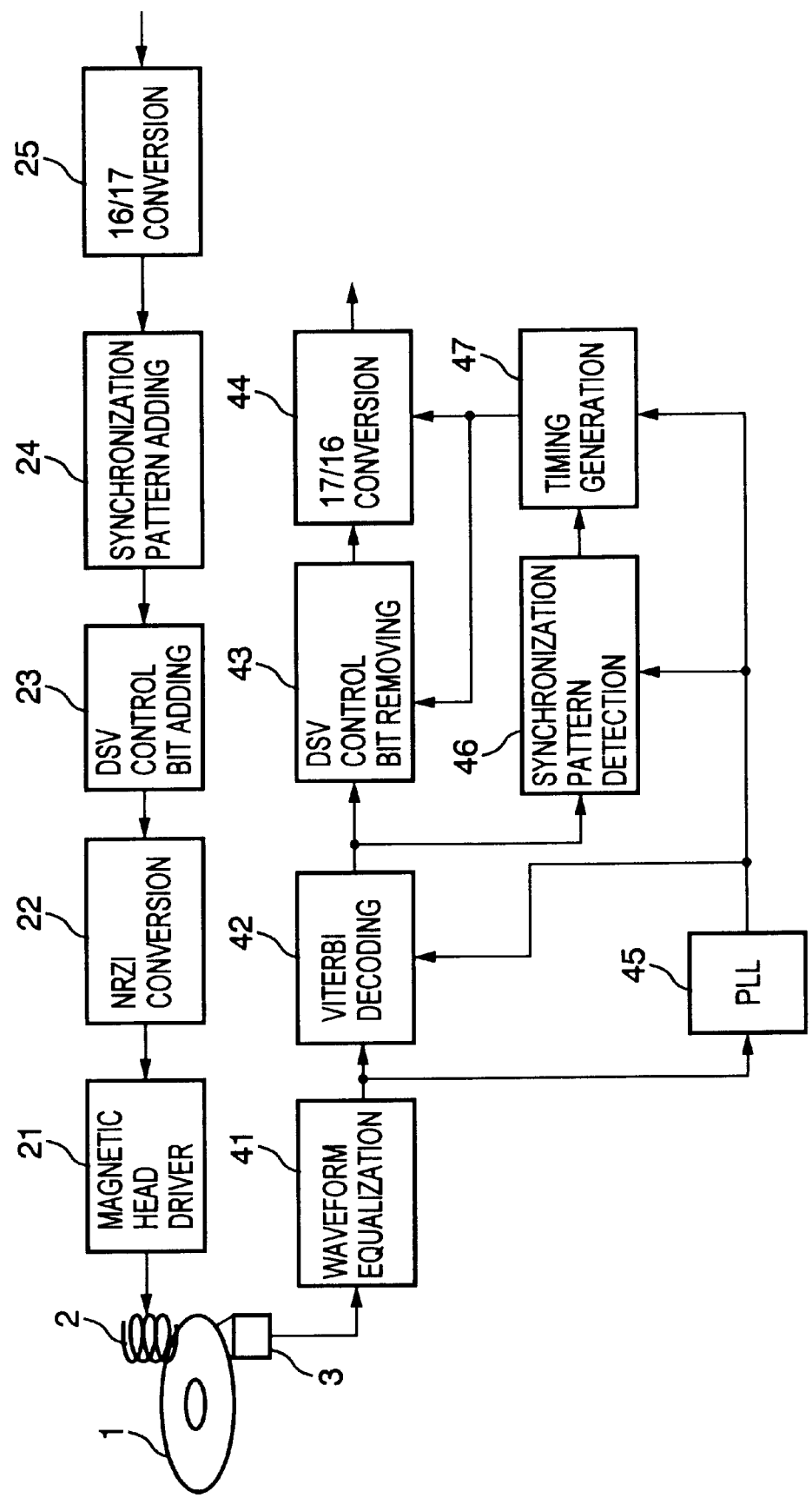
FIG. 4 is a view of the configuration of an optical magnetic recording/reproducing apparatus using a magneto-optical disk as an embodiment of the present invention.

FIG. 4 is a view of the configuration of a magneto-optical recording/reproducing apparatus according to an embodiment of the present invention.

The magneto-optical recording/reproducing apparatus shown in FIG. 4 comprises, as a recording system for recording data on a magneto-optical disk 1, a 16/17 conversion circuit 25, a synchronizing pattern adding circuit 24, a digital sum value (DSV) control bit adding circuit 23, an NRZI conversion circuit 22, and a magnetic field head driver 21.

The magneto-optical recording/reproducing apparatus shown in FIG. 4 comprises, as a reproducing system for reading and reproducing data from the magneto-optical disk 1, a waveform equalizing circuit 41, a viterbi decoding circuit 42, a DSV control bit removing circuit 43, a 16/17 conversion circuit 44, a channel bit synchronizing clock generation circuit 45 by PLL, a synchronizing pattern detection circuit 46, and a timing generation circuit 47.

As the magneto-optical disk 1, for example, it can be adopted a magneto-optical disk in Japanese Patent Application No. 11-176029 for an "Optical Recording Medium and Disk Cartridge" filed on Jun. 22, 1999 by the assignee of the present application, an ultra-compact, high density, large capacity magneto-optical disk having a diameter of 38 mm and a storage capacity of 2 GB or a diameter of 65 mm and a storage capacity of 4 GB may be applied.

In that case, a laser diode installed in an optical pickup 3 preferably is a blue colon laser.

The magneto-optical disk 1 is rotated by a not shown spindle motor. Data is recorded on the magneto-optical disk 1 by a light beam emitted from a laser diode built in the recording magnetic head 2 and the optical pickup 3. When reading data recorded in the magneto-optical disk 1, a light beam from a laser diode built in the optical pickup 3 is reflected on the magneto-optical disk 1 and detected by a detector built in the optical pickup 3. Of course, the output of the laser diode differs between when recording data and when reading data.

Tracking control and focal control of the optical pickup 3 are performed by the not illustrated well-known methods and means.

The operation of recording data on the magneto-optical disk 1 will be explained in brief below.

Every 16 bits of digital data to be recorded on the magneto-optical disk 1 is converted to 17 bits of codeword by the 16/17 conversion circuit 25. A codeword bit after conversion will be referred to as a channel bit hereinafter. The detailed processing method of the 16/17 conversion will be explained later on.

Figure 5:
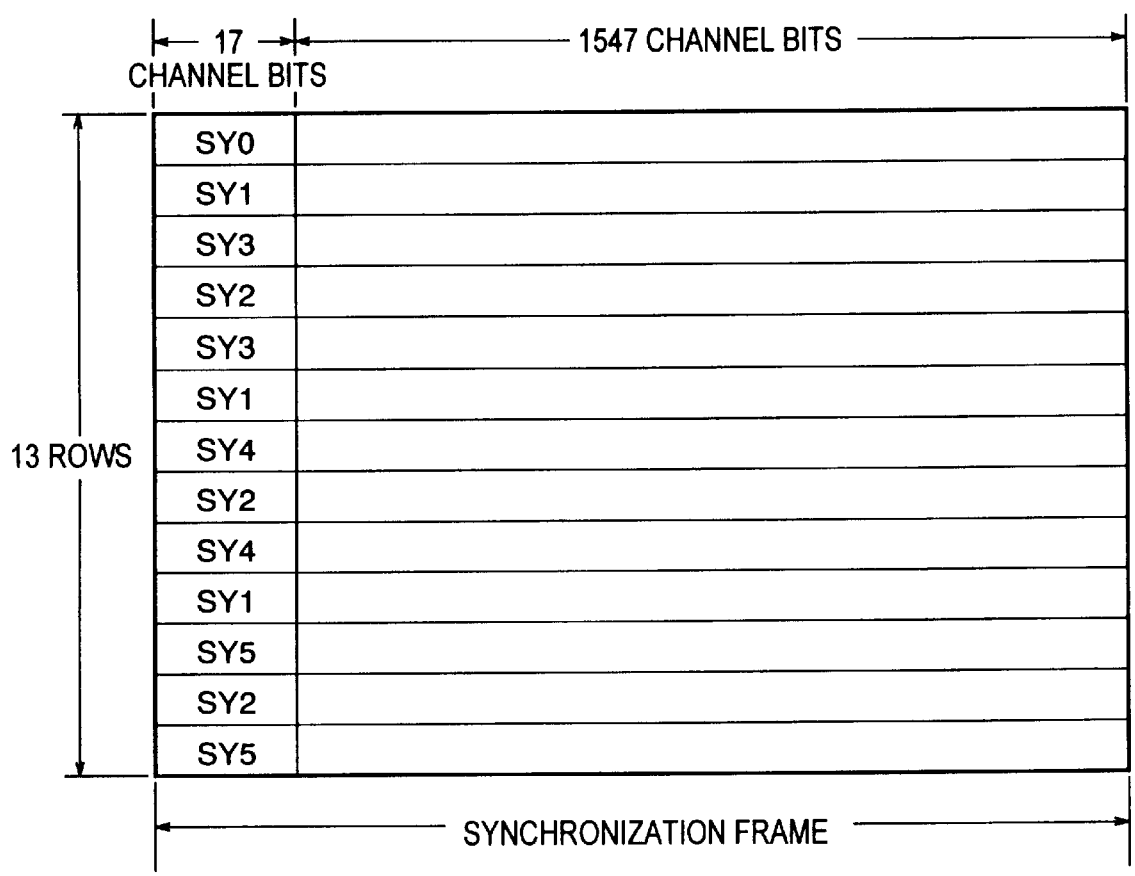
FIG. 5 is a view for explaining the configuration of a synchronizing frame to which a synchronizing pattern is inserted.

The data converted in the 16/17 conversion circuit 25 has added to it in the synchronizing pattern adding circuit 24 a 2-byte (17 channel bits) synchronizing pattern SY for every 182-byte (1547 channel bits) frame as illustrated in the configuration of the physical sub-selector in FIG. 5.

Figure 6:
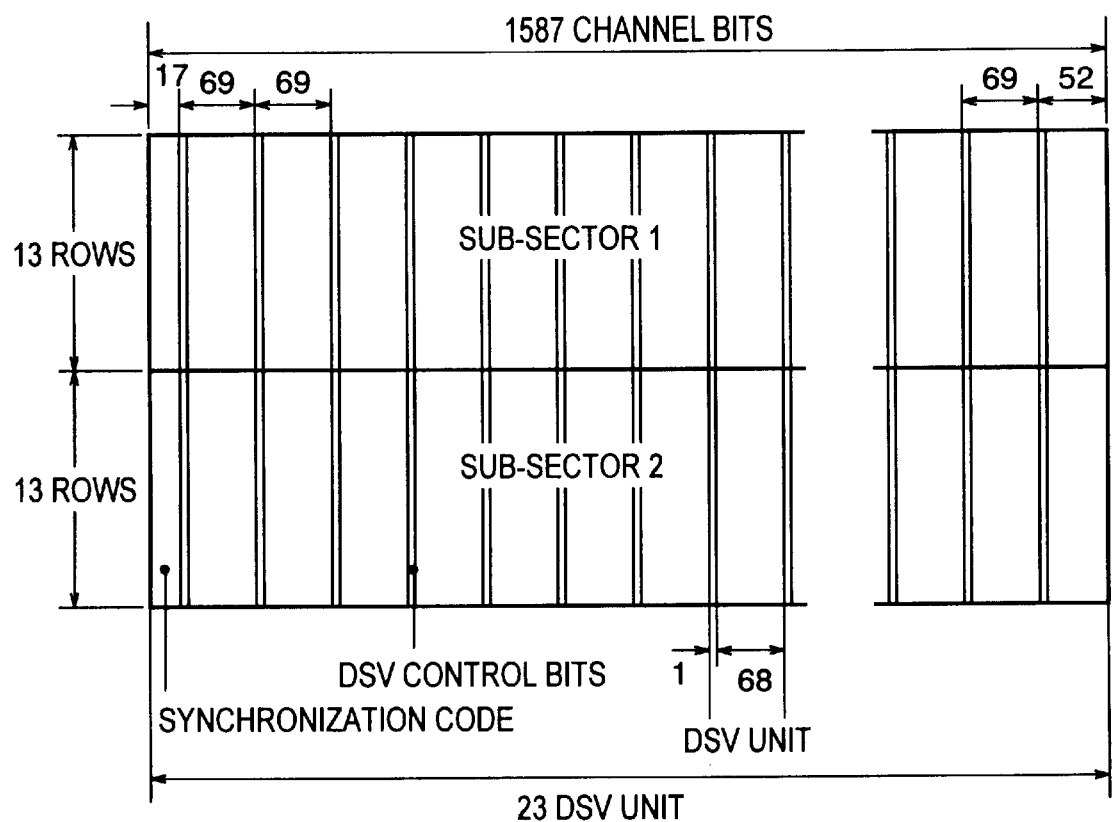
FIG. 6 is a view of an insertion position of a DSV control bit.

The frame data of 1564 (17+1547) channel bits, to which a synchronizing pattern is added in the synchronizing pattern adding circuit 24, has added to it, for example, as explained in the example of insertion of DSV control bits in FIG. 6, one channel bit of a DSC control bit for every 68 channel bits in the DSV control bit adding circuit 23.

Furthermore, the data is modulated in the NRZI conversion circuit 22 to recording data of an NRZI format, applied to a recording magnetic head 2 via a magnetic field head driver 21, and becomes an external magnetic field of the magneto-optical disk 1.

When recording the data on the magneto-optical disk 1, a large current is applied to the laser diode in the optical pickup 3, laser light of a high output power is emitted from the laser diode to the magneto-optical disk 1, and changes of the magnetic field at the magnetic head 2 are recorded on a recording film of the magneto-optical disk 1.

Processing of 16/17 Conversion Circuit 25

The 16/17 conversion processing in the 16/17 conversion circuit 25 will be explained in detail.

When converting 16-bit data to 17 bits, there are 131742 ($2^{17}$) patterns of a 17-bit bit train. The present inventors selected from among them those which fulfill the conditions below and generated a codeword of (0,6) RLL.

Condition 1: There are not more than three consecutive "0"s at the head and tail.

Condition 2: There are not more than six consecutive "0"s in the 17-channel-bit word.

Condition 3: There are not more than N/2 consecutive "1"s at the head and tail.

Condition 4: There are not more than N consecutive "1"s in the 17-channel-bit word.

When the above conditions are met and N=4, there are 68800 17-channel-bit bit patterns satisfying the above conditions and it is possible to link them one-to-one with the 16-bit data (65536). Accordingly, 16/17 conversion can be attained.

When linking 16 bits to 17 channel bits by this method, however, if there is even one channel bit of error in the 17 channel bits at the time of decoding, the entire 16 bits will become errors, so the reliability is low.

Considering that all the error correction codes actually used currently in optical disks and magneto-optical disks use 8 bits as one symbol, codes which easily give rise to two-symbol error are inconvenient. Therefore, it is preferable to set modulation rules so that one channel bit of error affects only the upper or lower 8 bits in the 16 bits as much as possible. Thus, the following method was applied in the present embodiment.

17-Bit Data Configuration

Figure 7:
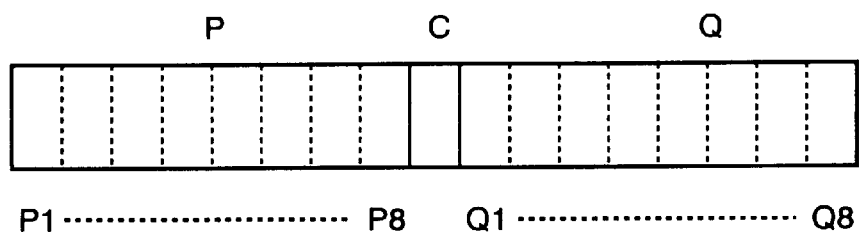
FIG. 7 is a view of the configuration of 17-bit data.

A 17-bit data configuration is, as shown in FIG. 7, comprised of 8 bits each of first (upper) data P and second (lower) data Q sandwiching one central check bit C. Since the first data P and the second data Q are separately coded, the effects on error between the two are small.

By configuring the 17-bit data as such, the result is a combination of 8 bits of first data P, 8 bits of second data Q, and one check bit C.

Furthermore, the 16 bits of data to be recorded are divided to data H of the upper 8 bits and data L of the lower 8 bits. The 16/17 conversion circuit 25 converts each from 8-bit data to 8-bit data (called 8—8 conversion) and assigns each to the first data P and the second data Q. This processing will be explained below.

The following restrictions are imposed on the 8—8 conversion.

Restriction 1: Restriction as to consecutive "0"s (not more than 4 at the head, not more than 3 at the tail, and not more than 7 in the middle)

Restriction 2: Restriction as to consecutive "1"s (not more than 6 at the head and not more than 5 at the tail)

Figure 8:
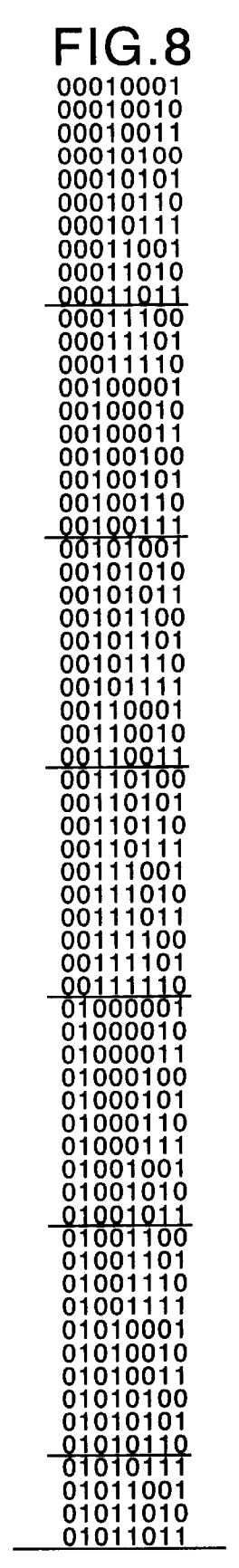
Figure 9:
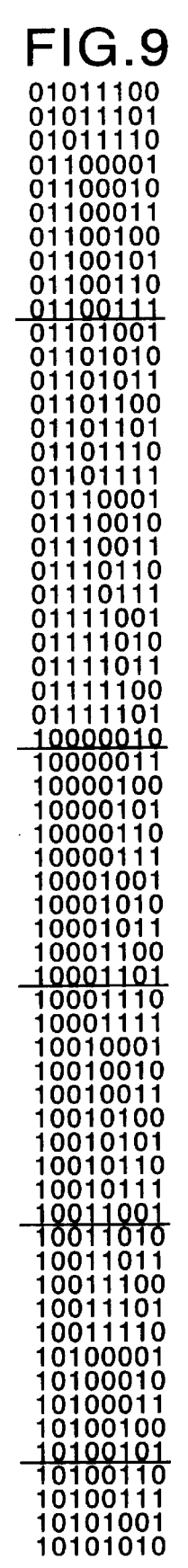
Figure 10:
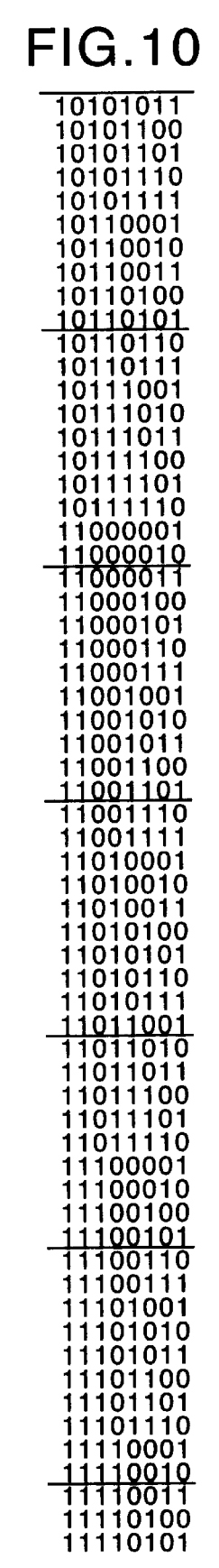

There are 199 8-bit data fulfilling the above restrictions. In the present embodiment, 192 are selected among them. The selected 192 are divided into three groups, each of which contains 64 bits, as shown in FIGS. 8 to 10 as Tables 1-1 to 1-3.

By restricting 199 to 192, the above restricting conditions are changed as below.

Corrected restriction 1: Restriction as to consecutive "0"s (not more than 4 at the head, not more than 3 at the tail, and not more than 7 in the middle)

Corrected restriction 2: Restriction as to consecutive "1"s (not more than 5 at the head and not more than 5 at the tail, that is, not more than 10 consecutive "1"s)

Figure 11:
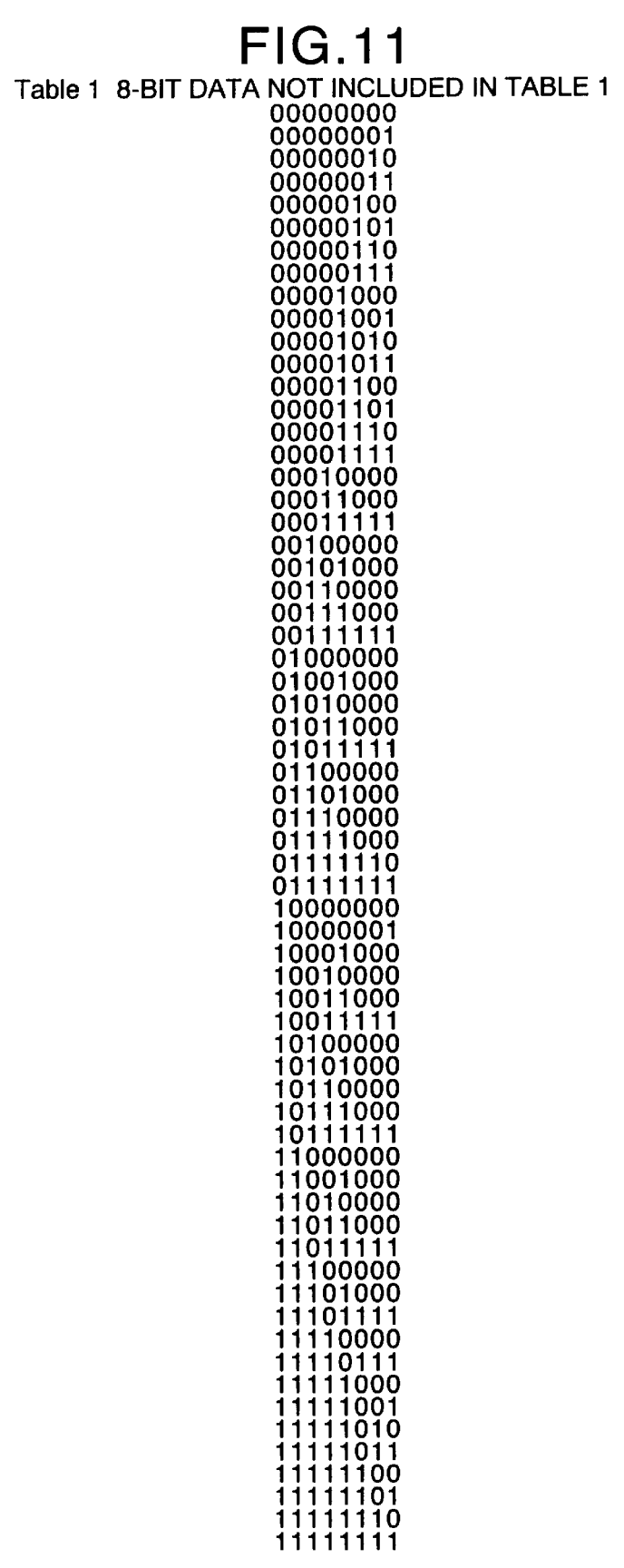

FIG. 11 shows as Table 1 the remaining 64 data not included in FIGS. 8 to 10.

The 16/17 conversion circuit 25 is provided with three coders tabularizing the data in FIGS. 8 to 10. In these coders, when the original data corresponds to the data shown in FIGS. 8 to 10, the data is used as it is in the codeword, while when it corresponds to the data shown in FIG. 11, the data is converted to the data shown in FIGS. 8 to 10. The correspondence for converting the data in FIG. 11 to the data in FIGS. 8 to 11 is shown in FIG. 12 as Table 2.

Figures 13, 14:
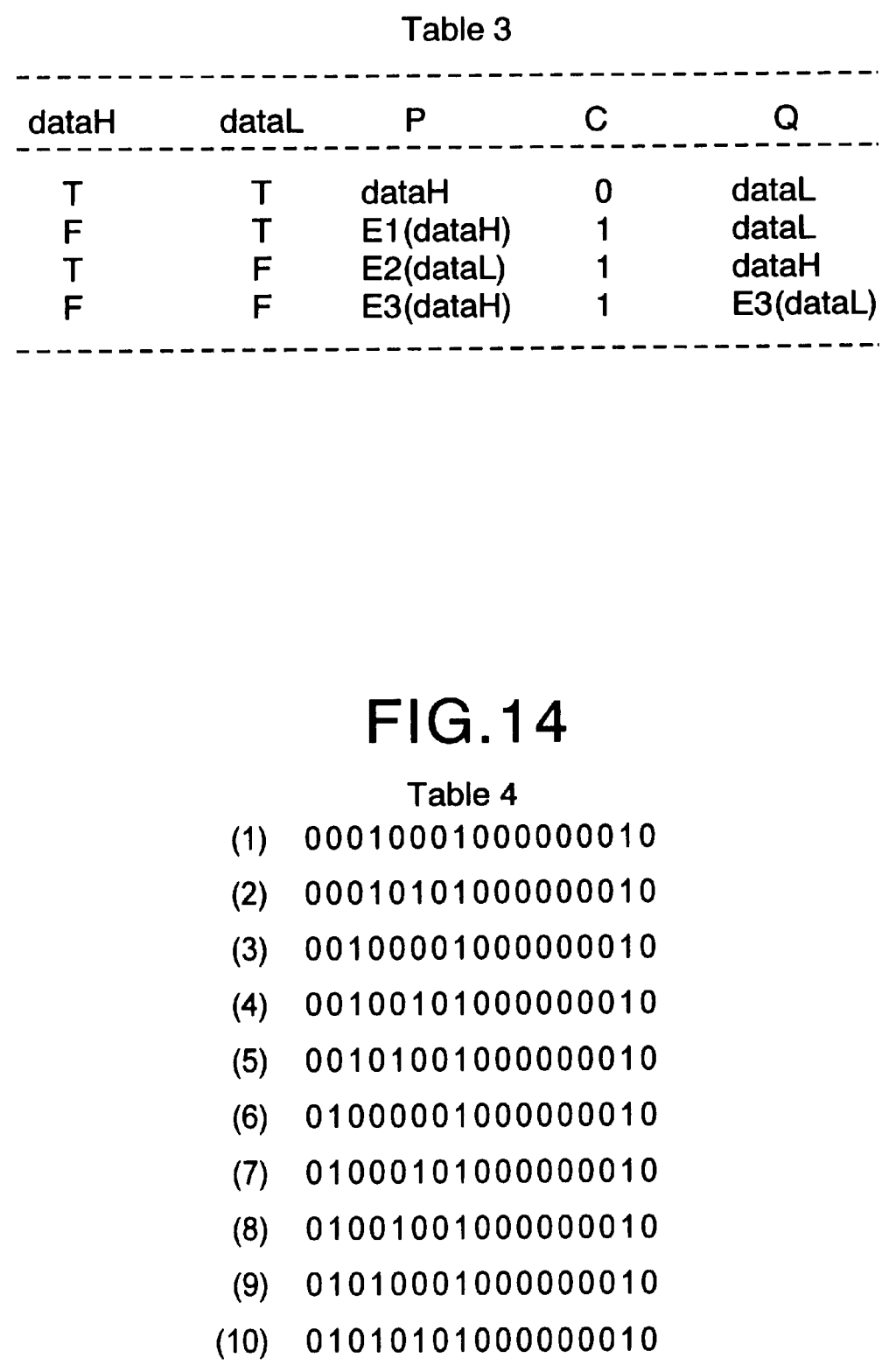

In the coders, when designating the case where the data R or the data L corresponds to the data shown in FIGS. 8 to 10 as true T, while designating the other case as false F, 17-bit data P, C, and Q illustrated in FIG. 7 come to have the result illustrated in FIG. 13 as Table 3.

When a false F arises in any of the data, the check bit C becomes "1". Accordingly, when the check bit C is "1", it indicates that a false F arose in the conversion.

In Table 3 illustrated in FIG. 13, it is indicated that a false F arose in E1 to E3 and E1 to E3 in Table 3 were used.

As explained above, the 16/17 conversion circuit performs 16/17 conversion.

Processing of Synchronizing Pattern Adding Circuit 24

A synchronizing pattern is inserted into the data at constant intervals as shown in FIG. 5 in order to establish synchronization of a larger unit than a channel bit for reproduction data.

Below, conditions of the synchronizing patterns will be considered.

(1) It is preferable to use a data pattern not included in a codeword so as to facilitate detection of a synchronizing pattern. Since 16/17 conversion is performed in the present embodiment, the run-length is restricted to (0, 6). Accordingly, as a synchronizing pattern used in the synchronizing pattern adding circuit 24, a synchronizing pattern including a part of a pattern wherein the run-length is 7 is used.

(2) When considering use of PR(1,1) for signal detection at the time of reproduction, it is preferable that the head and tail of the synchronizing pattern be "0" in order to ensure the detection of the synchronizing pattern. This is because the reproducing signal becomes three values, (+1, 0, −1) with PR(1,1), but if a pattern of "1" appears when connecting with data in front and behind, a "0" level continues in the three values, while when one or more "1" is inserted, a data change of "+1", "0", and "−1" or inverse data change of "−1", "0", and "+1" occurs, so it becomes possible to reliably detect an edge (change) of a signal.

(3) In the synchronizing pattern also, two or more consecutive "1"s are prevented.

(4) Ten examples of synchronizing patterns each having at the latter half of the synchronizing pattern a part wherein the run-length is 7, imposing the above conditions, and satisfying the restriction of an original run-length being 6 are 10 patterns illustrated in FIG. 14 as Table 4.

Also, as shown in FIG. 5, a set of one synchronizing pattern SY and data immediately behind the synchronizing pattern to data immediately in front of a synchronizing pattern of the next frame is called as a synchronizing frame. A larger unit than the synchronizing frame is a sub-sector illustrated in FIG. 5. When a sub-sector is comprised for example of 13 synchronizing frames, it is effective to arrange several kinds of synchronizing patterns in a specifically determined order in order to easily distinguish the head of a subsector from the reproduction data and a position of the data currently reproduced and inside the subsector.

In the present embodiment, for example, up to 10 kinds of synchronizing patterns can be used at maximum with respect to 13 synchronizing frames. When using them all, the arrangement becomes as illustrated in FIG. 15. However, an arrangement of the synchronizing patterns SY0 to SY2 has the disadvantage that the position cannot be specified unless going back three synchronizing frames.

Thus, a proposal for improvement has been considered. Since the head synchronizing frame of the sub-sector has special meaning, it is made to be discriminated independently. The remaining synchronizing frames are made specifiable in their position by going back one synchronizing frame. Therefore, when the synchronizing patterns are arranged in the order illustrated in FIG. 16 using six synchronizing patterns, the above restrictions can be satisfied.

The preferable selection of six patterns will be considered next.

The synchronizing patterns are divided into three groups A to C by their roles.

TABLE 5

| Group | Synchronizing pattern |
|---|---|
| A | SY0 |
| B | SY1, SY2 |
| C | SY3, SY4, SY5 |

If selecting the synchronizing patterns so that the groups have different characteristics, the synchronizing patterns can be more reliably detected.

Examples of such patterns are extracted from Table 4 (FIG. 14) and described below.

First Pattern Example

| A: SY0 | (1) 000100010000010 |
|---|---|

There is only one "1" in the first 7 channel bits and there is a "1" positioned at the fourth channel bit from the head.

| B: SY1 | (4) 001001010000010 |
|---|---|
| SY2 | (5) 001010010000010 |

There are two "1"s in the first 7 channel bits and there is a "1" positioned at the third channel bit from the head.

| C: SY3 | (7) 010001010000010 |
|---|---|
| SY4 | (8) 010010010000010 |
| SY5 | (9) 010100010000010 |

There are two "1"s in the first 7 channel bits and there is a "1" positioned at the second channel bit from the head.

Second Pattern Example

| A: SY0 | (1) 010000010000010 |
|---|---|

There is a "1" positioned at the second channel bit from the head.

| B: SY1 | (4) 000100010000010 |
|---|---|
| SY2 | (5) 000101010000010 |

There is a "1" positioned at the fourth channel bit from the head.

| C: SY3 | (7) 001000010000010 |
|---|---|
| SY4 | (8) 001001010000010 |
| SY5 | (9) 001010010000010 |

There is a "1" positioned at the third channel bit from the head.

Processing of DSV Control Bit Adding Circuit 23

The DSV control bit adding circuit 23 inserts a digital sum value (DSV) bit at the position illustrated in FIG. 6. The DSV indicates a value obtained by making "1" in the recording data after the NRZI conversion correspond to "+1" and "0" to "−1" and multiplying the values.

The DSV control bit is inserted by the DSV control bit adding circuit 23 as follows:

(1) When seven consecutive "0" will arise by insertion of "0" at the insertion position, the DSV control bit is made "1".

(2) In a case other than (1), the DSV is calculated until immediately before the insertion point of the next DSV control bit assuming that "0" and "1" are respectively inserted and a value having a smaller absolute value is made the DSV control bit.

A reproducing operation will be explained next.

A laser beam is irradiated from the optical pickup 3 to the magneto-optical disk. 1, and a change of the direction of polarization of the reflection light in accordance with the direction of magnetization on a recording film caused by the Kerr effect is converted to an electric signal by the same optical pickup 3. The electric signal is a reproduction signal of the magneto-optical disk 1.

The waveform equalizing circuit 41 performs waveform equalization so as to obtain frequency characteristics close to for example PR(1,1).

The channel bit synchronization clock generation circuit 45 using the phase lock loop (PLL) circuit reproduces the synchronization clock in units of channel bits in the PLL circuit based on the reproduction signal after waveform equalization.

The viterbi decoding circuit 42 performs maximum likelihood decoding corresponding to the characteristics of PR(1,1) by using the reproduced synchronization clock.

The synchronizing pattern detection circuit 46 detects a synchronizing pattern from the data after maximum likelihood decoding in the viterbi decoding circuit 42, while the timing generation circuit 47 detects synchronization in units of frames based on the detected synchronizing pattern and generates timing in units of a DSV control bit and codeword.

The DSV control bit removing circuit 43 removes a DSV control bit from the reproduced data based on the timing generated in the timing generation circuit 47.

The 17/16 conversion circuit 44, in the reverse way from the 16/17 conversion circuit, decodes from a 17-bit codeword to 16-bit data based on the timing in units of codewords.

FIG. 17 is a table (Table 6) of the 17/16 conversion method—the inverse of the conversion method shown in FIG. 13 used in the 16/17 conversion performed in the above explained 16/17 conversion circuit 26. The 17/16 conversion circuit 44 performs 17/16 conversion in the method shown in FIG. 17.

As a result, data recorded on the magneto-optical disk 1 can be reproduced.

Note that since data of three values of PR(1,1) is read from the magneto-optical disk 1, reproduction data can be reproduced by using a three-value (ternary) discrimination circuit instead of the viterbi decoding circuit 42 after waveform shaping in the waveform equalizing circuit 41.

In the above embodiment, a super resolution optical disk was described as an example as the magneto-optical disk 1, but the present embodiment is not limited to magneto-optical disks and may be applied to a variety of optical rotating recording media exhibiting PR(1,1) characteristics such as optical disks.

Summarizing the effects of the invention, when applying 16/17 conversion, data recording method and recording apparatus of the present invention, it becomes possible to reduce the shortest inversion intervals and broaden the detection window width from those in modulation used in optical disks and magneto-optical disks of the related art such as CDs, MDs and DVDs and a large amount of data can be stored in writeable optical rotating recording media.

Also, according to the reproducing method and the reproducing apparatus of the present invention, even when applying a data reproducing method suitable to response characteristics for a recording/reproducing system in optical rotating recording media, a large number of consecutive "1"s ceases to exist in the codeword. As a result, synchronization clock generation by a phase locked loop (PLL) becomes easy and an increase of the data error rate after decoding by a maximum likelihood decoding method such as a Viterbi algorithm is not caused.

Furthermore, according to the present invention, since low frequency components of the recording data are suppressed, it is possible to remove the low frequency components from the reproduction signal by a high pass filter etc. in order to remove the affects of changes in the reflectance and birefringence of a disk substrate.

Also, in the 16/17 conversion, synchronizing patterns capable of correctly recognizing punctuation of 17-bit codewords are determined.

While the invention has been described by reference to specific embodiments chosen for purposes of illustration, it should be apparent that numerous modifications could be made thereto by those skilled in the art without departing from the basic concept and scope of the invention.

For example, while not claimed, the present invention also suggests a data reproducing method for reproducing data from an optical rotating recording medium on which such modulated data is recorded.

It further suggests an optical recording/reproducing apparatus combining the above recording apparatus and reproduction apparatus.

Finally, it suggests a 16/17 conversion method for signal processing on media which exhibit partial response (1,1) characteristics and a 17/16 conversion method as its inverse conversion.

What is claimed is:

1. An optical rotating recording medium in which a 17-bit codeword converted from 16 bit data is recorded, wherein said 17-bit codeword is coded from a 16 bit-data word as a set with restrictive conditions on a minimum number (d) of consecutive zeros, a maximum number (k) of consecutive zeros, and a maximum number (r) of consecutive "1"s in the codeword; is converted as a "1" in a codeword to an inversion of "1" and "0" in recording data and a "0" in a codeword to non-inversion by non-return to zero inverse (NRZI), and is recorded under the condition where a "1" and "0" in the recording data are linked with the existence and non-existence of a pit on the optical rotating recording medium or two polarities of magnetization.

2. A data recording method for recording 16-bit data on an optical rotating recording medium by converting the same to a 17-bit codeword, including the steps of:

coding a 16-bit data word to a 17-bit codeword set with restrictive conditions on a minimum number (d) of consecutive zeros, a maximum number (k) of consecutive zeros, and a maximum number (r) of consecutive "1"s in the codeword;

converting a "1" in a codeword to an inversion of "1" and "0" in recording data and a "0" in a codeword to non-inversion by non-return to zero inverse (NRZI); and storing a "1" and "0" in the recording data linked with the existence and non-existence of a bit on said optical rotating recording medium or two polarities of magnetization.

3. A data recording method as set forth in claim 2, wherein said restrictive conditions of the coding method are that (d, k) is (0, 6) and r is not less than 4 and not more than 11.

4. A data recording method as set forth in claim 2, wherein said restrictive conditions of the coding method are that (d, k, r)=(0, 6, 9).

5. A data recording method as set forth in claim 4, wherein:

a series of an even number of bytes of equal or greater than 80 and equal or smaller than 256 of data to be recorded on said optical rotating recording medium is defined as one frame;

2-byte's worth of a synchronizing pattern per frame is added; and the synchronizing pattern is made easy to discriminate from the codeword by deviating from at least one of said restrictive conditions.

6. A data recording method as set forth in claim 2, wherein said synchronizing pattern deviates from the restriction of d=6 and includes seven consecutive "0"s.

7. A data recording method as set forth in claim 2, wherein at least six patterns SY0 to SY5 selected from 10 patterns in the following table are used as said synchronizing patterns:

TABLE

| |
|---|
| (1) 00010001000000010 |
| (2) 00010101000000010 |
| (3) 00100001000000010 |
| (4) 00100101000000010 |
| (5) 00101001000000010 |
| (6) 01000001000000010 |
| (7) 01000101000000010 |
| (8) 01001001000000010 |
| (9) 01010001000000010 |
| (10) 01010101000000010 |

8. A data recording method as set forth in claim 2, wherein at least two bits for suppressing a low frequency component of a bit series after NRZI conversion are inserted to the codeword for at least every 34 bits and at most 102 bits of codewords in the data coded by said coding method.

9. A data recording method as set forth in claim 8, wherein at least two bits for suppressing a subsonic frequency component of a bit series after NRZI conversion are inserted to the codeword for every 68 bits of codewords in the data coded by said coding method.

10. A data recording method as set forth in claim 2, including the steps of:

calculating a digital sum value (DSV) obtained by linking "1" in the recording data after the NRZI conversion to "+1" and "0" to "−1" and multiplying the values; and determining bits for suppressing low frequency components by respectively selecting always "1" in the case where the k restriction in said predetermined restrictive conditions is violated when "0" is inserted to an inserting position, while selecting a value which gives a smaller absolute value of said DSV until the point where the next bit for suppressing the subsonic frequency component is inserted in other cases.

11. A recording apparatus for recording a 17-bit codeword converted from a 16-bit data word on an optical rotating recording medium, comprising:

a 16/17 conversion means;

a synchronizing pattern adding means;

a DSV control bit adding means;

a non-return to zero inverse (NRZI) conversion means; and a magnetic field head driver means, wherein:

said 16/17 conversion means codes a 16-bit data word to a 17-bit codeword set with restrictive conditions of a minimum number (d) of consecutive zeros, a maximum number (k) of consecutive zeros, and a maximum number (r) of consecutive "1"s in the codeword;

said NRZI conversion means converts a "1" in a codeword to an inversion of "1" and "0" of recording data and "0" in the codeword to non-inversion by NRZI; and said magnetic head driver means records linking a "1" and "0" of the recording data with one of an existence of a bit on said optical rotating recording medium and two polarities of magnetization.

12. A recording apparatus as set forth in claim 11, wherein the restrictive conditions of the coding method in said 16/17 conversion means are that (d, k) is (0, 6) and r is not less than 4 and not more than 11.

13. A recording apparatus as set forth in claim 11, wherein the restrictive conditions of the coding method of said 16/17 conversion means are that (d, k, r)=(0, 6, 9).

14. A recording apparatus as set forth in claim 11, wherein:

a series of an even number of bytes of equal or greater than 80 and equal or smaller than 256 of data to be recorded on said optical rotating recording medium is defined as one frame;

said synchronizing pattern adding means adds 2-byte's worth of a synchronizing pattern per frame; and the synchronizing pattern is made easy to discriminate from the codeword by deviating from at least one of said restrictive conditions.

15. A recording apparatus as set forth in claim 11, wherein said synchronizing pattern to be added by said synchronizing pattern adding means deviates from said restriction of d=6 and includes seven consecutive "0"s.

16. A recording apparatus as set forth in claim 11, wherein at least six patterns SY0 to SY5 selected from 10 patterns in the following table are used as said synchronizing patterns:

TABLE

| |
|---|
| (1) 00010001000000010 |
| (2) 00010101000000010 |
| (3) 00100001000000010 |
| (4) 00100101000000010 |
| (5) 00101001000000010 |
| (6) 01000001000000010 |
| (7) 01000101000000010 |
| (8) 01001001000000010 |
| (9) 01010001000000010 |
| (10) 01010101000000010 |

17. A recording apparatus as set forth in claim 11, wherein said DSV control bit adding means inserts into the codeword at least two bits for suppressing a low frequency component of a bit series after NRZI conversion for at least every 34 bits and at most 102 bits of codewords in the data coded by said coding method.

18. A recording apparatus as set forth in claim 11, wherein said DSV control bit adding means inserts into the codeword at least two bits for suppressing a low frequency component of a bit series after NRZI conversion for every 68 bits of codewords in the data coded by said coding method.

19. A recording apparatus as set forth in claim 11, wherein said DSV control bit adding means:

calculating a digital sum value (DSV) obtained by linking "1" in the recording data after the NRZI conversion to "+1" and "0" to "−1" and multiplying the values and determining bits for suppressing subsonic frequency components by respectively selecting always "1" in the case where the k restriction in said predetermined restrictive conditions is violated when "0" is inserted to an inserting position, while selecting a value which gives a smaller absolute value of said DSV until the point where the next bit for suppressing the subsonic frequency component is inserted in other cases.

20. A reproducing apparatus for reproducing data recorded on an optical rotating recording medium, wherein:

said optical rotating recording medium stores 17-bit codeword converted from a 16 bit data, said a 17-bit codeword is coded from the 16 bit data as a set with restrictive conditions of a minimum number (d) of consecutive zeros, a maximum number (k) of consecutive zeros, and a maximum number (r) of consecutive "1"s in a codeword; is converted as a "1" in a codeword is converted to an inversion of "1" and "0" of recording data and "0" in the codeword to non-inversion by NRZI, and is recorded under the condition where a "1" and "0" of the recording data are linked with the existence or non-existence of a pit on said optical rotating recording medium and two polarities of magnetization; and wherein said reproducing apparatus comprises:

a means for reproducing a clock from data read from said optical rotating recording medium;

a means for decoding the read data by a maximum likelihood method by referring to said reproduced clock; and a 17/16 conversion means for converting said decoded 17-bit codeword to a 16-bit data word.

21. A reproducing apparatus as set forth in claim 20, wherein said reproducing apparatus comprises a synchronizing pattern detection means for detecting a synchronizing pattern from the data decoded by said decoding means.

* * * * *

UNITED STATES PATENT AND TRADEMARK OFFICE
CERTIFICATE OF CORRECTION

PATENT NO. : 6,268,812 B1
DATED : July 31, 2001
INVENTOR(S) : Shunji Yoshimura

It is certified that error appears in the above-identified patent and that said Letters Patent is hereby corrected as shown below:

Column 1,
Line 51, change "Th" to -- Tb --.
Line 53, change "8/16modulation" to -- 8/16 modulation --.

Column 2,
Line 41, after " "0"s ", insert -- is --.
Line 63, change "maxim-m" to -- maximum --.

Column 5,
Line 52, change "16/17" to -- 17/16 --.

Column 6,
Lines 32 and 54, change "16/17" to -- 17/16 --.
Line 62, change "Jun." to -- June --.

Column 8,
Line 53, change "R" to -- H --.

Column 9,
Line 17, change "1" (third occurrence) to -- 11 --.

Column 11,
Line 2, delete the period.

Signed and Sealed this

Thirtieth Day of April, 2002

*Attest:*

*Attesting Officer*

JAMES E. ROGAN
*Director of the United States Patent and Trademark Office*